US 6,538,316 B2

(12) United States Patent
Maetani

(10) Patent No.: US 6,538,316 B2
(45) Date of Patent: Mar. 25, 2003

(54) HIGH FREQUENCY SEMICONDUCTOR DEVICE HOUSING PACKAGE

(75) Inventor: Maraki Maetani, Kyoto (JP)

(73) Assignee: Kyocera Corporation, Kyoto (JP)

( * ) Notice: Subject to any disclaimer, the term of this patent is extended or adjusted under 35 U.S.C. 154(b) by 0 days.

(21) Appl. No.: 10/108,922

(22) Filed: Mar. 27, 2002

(65) Prior Publication Data
US 2002/0140090 A1 Oct. 3, 2002

(30) Foreign Application Priority Data

Mar. 29, 2001 (JP) ........................................ 2001-097724

(51) Int. Cl.⁷ ............................................. H01L 23/053
(52) U.S. Cl. ...................... 257/700; 257/678; 257/723; 257/725; 257/734
(58) Field of Search ................... 257/678, 700, 257/723, 724, 725, 728, 734, 758, 759, 773, 774, 779, 780, 778; 29/832, 840, 852; 438/106, 108, 612, 613, 622, 623; 174/52.4, 255, 261, 262, 263

(56) References Cited

U.S. PATENT DOCUMENTS

| | | | | |
|---|---|---|---|---|
| 5,483,421 A | * | 1/1996 | Gedney et al. ............. | 361/771 |
| 5,640,048 A | * | 6/1997 | Selna ......................... | 257/738 |
| 5,832,598 A | * | 11/1998 | Greenman et al. ............ | 29/840 |
| 5,952,709 A | * | 9/1999 | Kitazawa et al. ........... | 257/664 |
| 6,057,600 A | * | 5/2000 | Kitazawa et al. ........... | 257/728 |
| 6,441,471 B1 | * | 8/2002 | Maetani ....................... | 257/664 |

FOREIGN PATENT DOCUMENTS

| | | | |
|---|---|---|---|
| EP | 399161 | * | 3/1990 |
| JP | 8-236655 | | 9/1996 |
| JP | 10-501102 | | 1/1998 |
| JP | 10-178144 | | 6/1998 |

OTHER PUBLICATIONS

10–501102 correspond to WO 96/27282.

* cited by examiner

Primary Examiner—Albert W. Paladini
Assistant Examiner—Alonzo Chambliss
(74) Attorney, Agent, or Firm—Hogan & Hartson, LLP

(57) ABSTRACT

A high frequency semiconductor device housing package comprises a dielectric substrate, an internal signal wiring conductor, an interlayer grounding conductor layer, a signal wiring conductor, a ball-shaped signal terminal mounting pad, and a grounding conductor layer. In the interlayer grounding conductor layer opposed to the signal wiring conductor is provided a conductive layer non-forming portion so as to be located in a region directly above the ball-shaped signal terminal mounting pad. An effective distance from the ball-shaped signal terminal mounting pad to the interlayer grounding conductor layer is made greater than an effective distance from the ball-shaped signal terminal mounting pad to the grounding conductor layer. With this configuration, the parasitic capacitance at the pad is reduced and a high frequency signal is efficiently transmitted.

3 Claims, 2 Drawing Sheets

HIGH FREQUENCY SEMICONDUCTOR DEVICE HOUSING PACKAGE

BACKGROUND OF THE INVENTION

1. Field of the Invention

The present invention relates to a high frequency semiconductor device housing package for mounting and housing therein a high frequency semiconductor device such as a high frequency semiconductor circuit device used in the microwave or millimeter wave region, the package being of the type generally known as a ball grid array package which is mounted on an external electrical circuit board via ball-shaped terminals. More particularly, the invention relates to a high frequency semiconductor device housing package that ensures high mounting yields, and that enhances the efficiency of high frequency signal transmission at ball-shaped signal terminal mounting pads to which the ball-shaped signal terminals are attached.

2. Description of the Related Art

An external electrical circuit board, such as a mounting board for mounting thereon a high frequency semiconductor device housing package with a high frequency semiconductor device housed therein, uses planar circuits such as microstrip lines as circuit interconnections on its surface. In particular, in cases where a high frequency semiconductor device housing package having a large number of ball-shaped terminals arranged in a grid pattern on the lower surface thereof, i.e., the so-called ball grid array package, is surface mounted on an external electrical circuit board, an interconnect structure in which grounding conductor layers such as coplanar microstrip lines are formed in the same plane as signal wiring conductors is advantageously used as the circuit interconnect structure on the external electrical circuit board, because it has good affinity from the viewpoint of package grounding.

The mounting of the high frequency semiconductor device housing package on the external electrical circuit board is completed as follows. Ball-shaped terminal mounting pads are formed at the ends of the signal wiring conductors of the mounting board having the above wiring structure, and are connected via ball-shaped signal terminals formed by solder or like material to the ball-shaped terminal mounting pads formed on the lower surface of the package. Then, the grounding conductor layers formed on the upper surface of the mounting board and the lower surface of the package in such a manner as to surround the ball-shaped terminal mounting pads are interconnected via ball-shaped grounding terminals, and the ball-shaped terminal mounting pads for a bias circuit are also interconnected via ball-shaped bias terminals.

The high frequency semiconductor device housing package described above not only can reduce the mounting area compared with conventional packages with external leads, but also can address the need for smaller package dimensions since the circuit interconnects within the package can be formed in multiple layers by using multilayer technology.

The high frequency semiconductor device housing package also has the advantage that when mounting the package using the ball-shaped terminals, the self alignment effect of the ball-shaped terminals ensures good mounting accuracy and provides excellent affinity for automation of the mounting work, as well as the advantage of high mass producibility offered by thick film printing and multiple dielectric layer deposition technologies.

However, the prior art high frequency semiconductor device housing package of the ball grid array type described above has had the problem that the ball-shaped terminal mounting pads consume large area compared with the fine signal wiring conductors, because there is a need to increase the bonding strength by increasing the size of the ball-shaped terminal mounting pads in order to enhance the mounting reliability of the ball-shaped terminals. That is, in the case of a distributed constant circuit used in the microwave or millimeter wave band, in particular, if there is a wide line portion in a circuit interconnect, the capacitance formed at that portion increases, increasing parasitic capacitance and decreasing the characteristic impedance of the circuit interconnect, resulting in increased reflections of the high frequency signal due to impedance mismatch; hence, the prior art has had the problem that as the frequency of the signal increases, transmission of the signal becomes increasingly difficult.

SUMMARY OF THE INVENTION

The present invention has been devised in view of the above problem associated with the prior art, and an object of the invention is to provide a high frequency semiconductor device housing package whose ball-shaped signal terminal mounting pads have good high frequency signal transmission characteristics at microwave or millimeter wave frequency, without losing the benefits of a ball grid array package, such as high mounting accuracy and excellent affinity for mounting work automation, reduced mounting area and package dimensions, and high mass producibility of thick film printing and multiple dielectric layer deposition technologies.

The invention provides a high frequency semiconductor device housing package, comprising:

a dielectric substrate fabricated by stacking a plurality of dielectric layers one on top of another, the dielectric substrate having, on its one surface, a mounting and housing portion for mounting and housing therein a high frequency semiconductor device;

an internal signal wiring conductor formed within the dielectric substrate so as to extend from the mounting and housing portion through another surface of the dielectric substrate opposite to the one surface, to which an electrode of the high frequency semiconductor device is electrically connected;

an interlayer grounding conductor layer formed between the dielectric layers;

a signal wiring conductor formed on the other surface of the dielectric substrate so as to be opposed to the interlayer grounding conductor layer, the signal wiring conductor being electrically connected to the internal signal wiring conductor;

a ball-shaped signal terminal mounting pad provided on a tip of the signal wiring conductor; and a grounding conductor layer formed in such a manner as to surround the signal wiring conductor and the ball-shaped signal terminal mounting pad, wherein, in the interlayer grounding conductor layer opposed to the signal wiring conductor is provided a conductive layer non-forming portion so as to be located in a region directly above the ball-shaped signal terminal mounting pad, and wherein an effective distance from the ball-shaped signal terminal mounting pad to the interlayer grounding conductor layer is made greater than an effective distance from the ball-shaped signal terminal mounting pad to the grounding conductor layer.

According to the invention, the internal ground conductor layer, disposed opposite the signal wiring conductor formed on a lower surface, i.e. the other surface of the dielectric substrate, is provided with a conductor layer non-forming portion in the region directly above the ball-shaped signal terminal mounting pad formed on the tip portion of the signal wiring conductor on the lower surface, and the effective distance from the ball-shaped signal terminal mounting pad to the interlayer grounding conductor layer is thus made greater than the effective distance from the ball-shaped signal terminal mounting pad to the conductor layer that is formed on the lower surface in such a manner as to surround the ball-shaped signal terminal mounting pad; with this configuration, the capacitance formed between the ball-shaped signal terminal mounting pad and the interlayer grounding conductor layer directly above it can be held to a low value. Thus, the parasitic capacitance at the interconnection between the transmission line on the upper surface of the external electrical circuit board, to which the ball-shaped signal terminal mounting pad is connected via a ball-shaped signal terminal, and the transmission line on the lower surface of the package, of which the ball-shaped signal terminal mounting pad is a part, can be reduced, so that signals up to the high frequency regions of microwave or millimeter wave frequency can be efficiently passed through the ball-shaped signal terminal mounting pad.

According to the invention, it becomes possible to provide a high frequency semiconductor device housing package whose ball-shaped signal terminal mounting pads have good high frequency signal transmission characteristics at microwave or millimeter wave frequency, without losing the benefits of a ball grid array package, such as high mounting accuracy and excellent affinity for mounting work automation, reduced mounting area and package dimensions, and high mass producibility of thick film printing and multiple dielectric layer deposition technologies.

In the invention, it is preferable that through-hole conductors for electrically connecting the grounding conductor layer with the interlayer grounding conductor layer by passing through the dielectric layers are formed around the conductor layer non-forming portion at intervals not larger than one quarter of a guide wavelength of a high frequency signal.

In the invention, it is preferable that ball-shaped grounding terminals for physically and electrically connecting the grounding conductor layer with a grounding conductor on an external electric circuit board are formed in the grounding conductor layer around the ball-shaped signal terminal mounting pad at intervals not larger than one quarter of a signal wavelength of a high frequency signal.

BRIEF DESCRIPTION OF THE DRAWINGS

Other and further objects, features, and advantages of the invention will be more explicit from the following detailed description taken with reference to the drawings wherein.

DETAILED DESCRIPTION OF THE PREFERRED EMBODIMENTS

Figure 1:
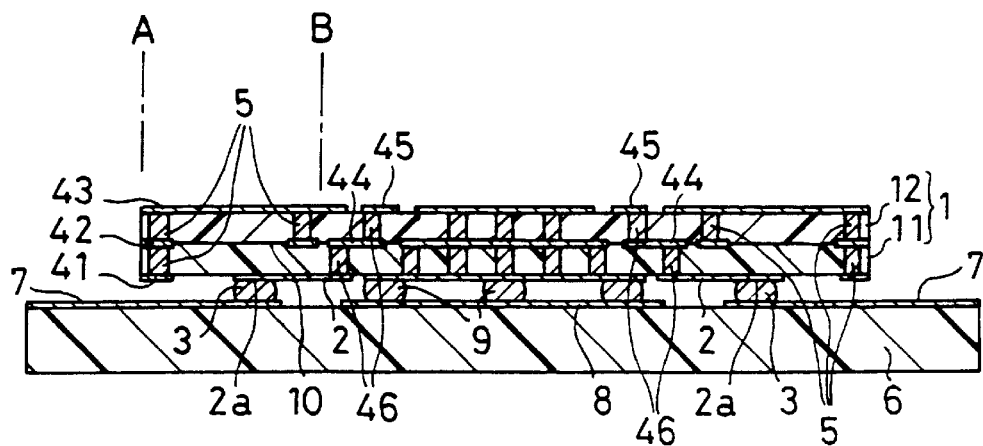
FIG. 1 is a cross sectional view showing a high frequency semiconductor device housing package according to an embodiment of the present invention.

Now referring to the drawings, preferred embodiments of the invention are described below.

FIG. 1 is a cross sectional view showing a high frequency semiconductor device housing package according to an embodiment of the present invention. In FIG. 1, reference numerals 11 and 12 show dielectric layers, which are stacked one on top of the other to form a dielectric substrate 1. A high frequency semiconductor device mounting portion (not shown) is formed on one surface, i.e. an upper surface, of the dielectric substrate 1, more specifically, in a planar surface area of the dielectric substrate 1 or in a recessed area thereof.

Reference numeral 2 shows a signal wiring conductor formed on the other surface, i.e. a lower surface, of the dielectric substrate 1, 2a is a ball-shaped signal terminal mounting pad formed on the tip of the signal wiring conductor 2, and 3 shows a ball-shaped signal terminal attached to the ball-shaped signal terminal mounting pad 2a.

Reference numeral 41 shows a grounding conductor layer formed on the lower surface of the dielectric substrate 1 in such a manner as to surround the signal wiring conductor 2 and the ball-shaped signal terminal 2a, 42 shows an interlayer grounding conductor layer formed between the dielectric layers 11 and 12, namely, in the inner layer of the dielectric substrate 1 so as to be opposed to the signal wiring conductor 2 formed on the lower surface of the dielectric substrate 1, and 43 shows a grounding conductor layer used to form a desired high frequency circuit on the upper surface of the dielectric substrate 1. Further, reference numeral 5 designates through-hole grounding conductors formed within the dielectric substrate 1 by passing through the dielectric layers 11 and 12. The grounding through-hole conductors 5 interconnect the grounding conductor layer 41, the interlayer grounding conductor layer 42, and the grounding conductor layer 43. Note that, in this high frequency semiconductor device housing package are also formed through-hole signal conductors 46 and through-hole biasing conductors which interconnect the signal wiring conductor 2 on the lower surface, an interlayer wiring conductor 44, and a signal wiring conductor 45 on the upper surface.

Reference numeral 6 is an external electrical circuit board such as a mounting board, on the upper surface of which are formed a signal conductor 7 and a grounding conductor 8 in corresponding relationship to the ball-shaped signal terminal mounting pad 2a and the grounding conductor layer 41, respectively. The ball-shaped signal terminal mounting pad 2a on the lower surface of the package and the signal conductor 7 on the upper surface of the external electrical circuit board 6 are physically and electrically interconnected by the ball-shaped signal terminal 3. Reference numeral 9 designates ball-shaped grounding terminals for physically and electrically connecting the grounding conductor layer 41 on the lower surface of the package with the grounding conductor 8 on the upper surface of the external electrical circuit board 6.

Reference numeral 10 indicates a conductive layer non-forming portion provided in the interlayer grounding conductor layer 42 in the region directly above and opposite the ball-shaped signal terminal mounting pad 2a. By providing the conductive layer non-forming portion 10 in the interlayer grounding conductor layer 42, the effective distance from the ball-shaped signal terminal mounting pad 2a to the interlayer grounding conductor layer 42 is made greater than the effective distance from the ball-shaped signal terminal mounting pad 2a to the grounding conductor layer 41. If the conductive layer non-forming portion 10 is not provided, the ball-shaped signal terminal mounting pad 2a will have a parasitic capacitance to the interlayer grounding conductor layer 42. By contrast, if the conductive layer non-forming portion 10 is provided, the capacitance value can be reduced, and signals in high frequency regions such as microwave or millimeter wave signals can be efficiently passed through the ball-shaped signal terminal mounting pad 2a.

The effective distance here does not mean a physical distance, but means an electrical effective distance which depends on the distribution of the dielectric. In the case of a substance filled with a dielectric having uniform permittivity, such as the interior of the dielectric substrate 1 of the package, the effective distance is equal to the physical distance multiplied by the reciprocal of the square root of the relative permittivity. On the other hand, in the case of the distance between the conductors on the surface of the dielectric substrate 1 of the package, since the distribution of the dielectric differs between the front and back of the conductors, the effective distance is given by multiplying the physical distance by the reciprocal of the square root of the effective relative permittivity. Accordingly, the effective distance from the ball-shaped signal terminal mounting pad 2a to the interlayer grounding conductor layer 42 is obtained by multiplying the physical distance by the reciprocal of the square root of the relative permittivity of the package material, i.e., the dielectric layers 11 and 12, etc., and on the other hand, the effective distance from the ball-shaped signal terminal mounting pad 2a to the grounding conductor layer 41 is obtained by multiplying the physical distance by the reciprocal of the square root of the effective relative permittivity that is determined based on the fill rate of the dielectric material in the package material, i.e., the dielectric layers 11 and 12, in the corresponding region.

When making the effective distance from the ball-shaped signal terminal mounting pad 2a to the interlayer grounding conductor layer 42 greater than the effective distance from the ball-shaped signal terminal mounting pad 2a to the grounding conductor layer 41, the effective relative permittivity is calculated based on the fill rate in the package material that is obtained from such parameters as the permittivity of the package material, the thickness of the dielectric substrate forming the package, the number of dielectric layers 11, 12, the shape of the ball-shaped signal terminal mounting pad 2a, the geometries of the grounding conductor layer 41 and interlayer grounding conductor layer 42, and the relative positional relationships between the ball-shaped signal terminal mounting pad 2a and the grounding conductor layer 41 and interlayer grounding conductor layer 42. In reality, however, the design can be done by evaluating the value of the capacitance between the ball-shaped signal terminal mounting pad 2a and the grounding conductor layer 41 through an approximation method such as numerical analysis, and by comparing it with the value of the capacitance between the ball-shaped signal terminal mounting pad 2a and the interlayer grounding conductor layer 42.

Figure 2:
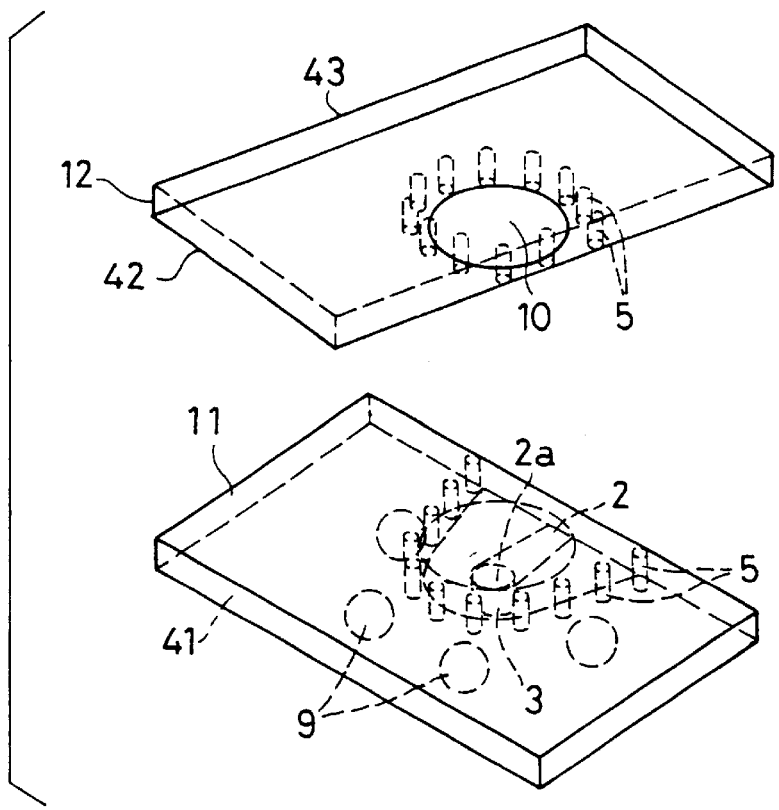
FIG. 2 is a perspective view, with essential portions broken away, of a part of the high frequency semiconductor device housing package according to the embodiment of the present invention.

FIG. 2 shows a perspective view, with essential portions broken away, of the high frequency semiconductor device housing package according to one embodiment of the present invention. In FIG. 2, the dielectric layers 11 and 12 in the A-B region of the high frequency semiconductor device housing package shown in FIG. 1 are separated from each other, revealing the dielectric layer 11 as viewed from the top side and the dielectric layer 12 as viewed from the bottom side. The same portions as those in FIG. 1 are designated by the same reference numerals. Moreover, FIG. 3 is a plan view showing the simplified structure of the periphery of the signal wiring conductor 2 in the dielectric layer 11, and FIG. 4 is a plan view showing the simplified structure of the periphery of the conductor layer non-forming portion 10 in the dielectric layer 12.

Figure 3:
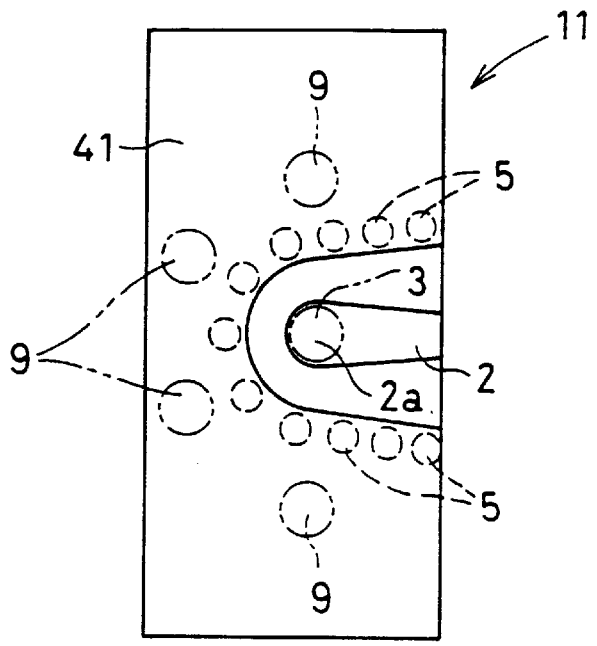
FIG. 3 is a plan view showing a simplified structure of a periphery of a signal wiring conductor.
Figure 4:
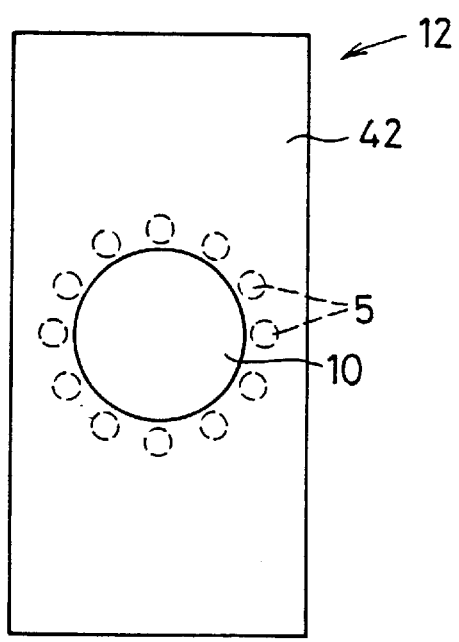
FIG. 4 is a plan view showing a simplified structure of a periphery of a conductor layer non-forming portion.

As shown in FIGS. 2 to 4, the signal wiring conductor 2 formed on the lower surface of the dielectric substrate 1, in this example, on the lower surface of the dielectric layer 11, is formed opposite the interlayer grounding conductor layer 42 formed on the lower surface of the dielectric layer 12 (the upper surface of the dielectric layer 11), and its tip is provided with the ball-shaped signal terminal mounting pad 2a to which is attached the ball-shaped signal terminal 3, while the grounding conductor layer 41 is formed on the lower surface of the dielectric layer 11 in such a manner as to surround the signal wiring conductor 2 and the ball-shaped signal terminal mounting pad 2a. The conductor layer non-forming portion 10, substantially similar in size to the ball-shaped signal terminal mounting pad 2a, as shown by a broken line in FIG. 2, is provided in the interlayer grounding conductor layer 42 in the region directly above and opposite the ball-shaped signal terminal mounting pad 2a. The effective distance from the ball-shaped signal terminal mounting pad 2a to the interlayer grounding conductor layer 42 is thus made greater than the effective distance from the ball-shaped signal terminal mounting pad 2a to the grounding conductor layer 41 formed in the same plane.

The through-hole conductors 5 for electrically connecting the grounding conductor layer 41 with the interlayer grounding conductor layer 42 are formed to ground the grounding conductor layer 41 and the interlayer grounding conductor layer 42 by bringing them into conduction. Moreover, the through-hole conductors 5 are arranged at intervals not larger than one quarter of the guide wavelength in order to prevent high frequency signals from entering the interior of the dielectric substrate.

Further, the through-hole conductors 5 for electrically connecting the interlayer grounding conductor layer 42 with the grounding conductor layer 43 are formed to ground the interlayer grounding conductor layer 42 and the grounding conductor layer 43 by bringing them into conduction. Moreover, the through-hole conductors 5 are arranged around the conductor layer non-forming portion 10 at intervals not larger than one quarter of the guide wavelength in order to prevent high frequency signals from entering the interior of the dielectric substrate.

On the other hand, the ball-shaped grounding terminals 9 for physically and electrically connecting the grounding conductor layer 41 with the grounding conductor 8 on the upper surface of the external electrical circuit board 6 are formed to ground the grounding conductor layer 41 and the grounding conductor 8 on the upper surface of the external electrical circuit board 6 by bringing them into conduction. Moreover, the ball-shaped grounding terminals 9 are arranged at intervals not larger than one quarter of the guide wavelength in order to prevent high frequency signals from leaking into the air gap between the dielectric substrate and the external electrical circuit board 6.

According to the high frequency semiconductor device housing package of the invention having the above construction, the high frequency signal supplied from the external electrical circuit board 6 to the package is propagated to the signal wiring conductor 2 on the package side via the ball-shaped signal terminal 3 and ball-shaped signal terminal mounting pad 2a connected to the signal conductor 7 of the external electrical circuit board 6. The signal conductor 7 of the external electrical circuit board 6 is usually formed in a coplanar stripline structure or a planar transmission line structure similar to it, and the grounding conductor 8 formed on the upper surface of the external electrical circuit board 6 serves as the ground plane for signal propagation; at this time, the electric field distribution is such that the electric field is directed from the signal conductor 7 toward the grounding conductor 8. Next, when the high frequency signal reaches the ball-shaped signal terminal 3, the electric field distribution is such that the electric field is directed from the ball-shaped signal terminal 3 toward the grounding conductor 8 of the external electrical circuit board 6, and is then further directed toward the ball-shaped grounding terminals 9 or the grounding conductor 41 on the lower surface of the package. When the high frequency signal reaches the signal wiring conductor 2 by passing through the ball-shaped signal terminal mounting pad 2a on the lower surface of the package, since the effective distance from the ball-shaped signal terminal mounting pad 2a to the interlayer grounding conductor layer 42, as well as the distance to the grounding conductor layer 43 through the conductor layer non-forming portion 10, is made greater because of the provision of the conductor layer non-forming portion 10 than a conventional package having an interlayer grounding conductor layer where the conductor layer non-forming portion 10 is not provided and thus the interlayer grounding conductor layer 42 and the grounding conductor layer 43 are located away from the ball-shaped signal terminal mounting pad 2a, the increase in the unwanted parasitic capacitance formed on the signal transmission line can be suppressed even when the signal wiring conductor 2 is made wider at the ball-shaped signal terminal mounting pad 2a in order to ensure the mounting reliability of the ball-shaped terminal 3. In this case, since the electric field distribution in the vicinity of the ball-shaped signal terminal mounting pad 2a is such that the electric field is essentially directed from the signal wiring conductor 2 toward the grounding conductor 41 formed in the same plane as the signal wiring conductor 2, and the field distribution is thus made suitable for the high frequency transmission line, the high frequency signal can be transmitted efficiently.

The dielectric substrate of the high frequency semiconductor device housing package of the invention described above, and its constituent elements, such as the dielectric layers 11 and 12, the high frequency semiconductor device mounting portion formed in the upper surface of the substrate, the internal wiring conductors 44 for carrying signals, the interlayer grounding conductor layer 42, through-hole conductors such as the through-hole grounding conductors 5, the signal wiring conductor 2, the ball-shaped signal terminal mounting pad 2a, the grounding conductor layers 41 and 43, ball-shaped terminals such as the ball-shaped signal terminal 3 and ball-shaped grounding terminals 9, as well as the external electrical circuit board 6 on which the package is to be mounted and the signal conductor 7, grounding conductor 8, etc. formed thereon, may be formed in suitable shapes and dimensions using prior known materials and fabrication processes, which are not specifically limited to any particular materials or fabrication processes.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. A high frequency semiconductor device housing package, comprising:

a dielectric substrate fabricated by stacking a plurality of dielectric layers one on top of another, the dielectric substrate having, on its one surface, a mounting and housing portion for mounting and housing therein a high frequency semiconductor device;

an internal signal wiring conductor formed within the dielectric substrate so as to extend from the mounting and housing portion through another surface of the dielectric substrate opposite to the one surface, to which an electrode of the high frequency semiconductor device is electrically connected;

an interlayer grounding conductor layer formed between the dielectric layers;

a signal wiring conductor formed on the other surface of the dielectric substrate so as to be opposed to the interlayer grounding conductor layer, the signal wiring conductor being electrically connected to the internal signal wiring conductor;

a ball-shaped signal terminal mounting pad provided on a tip of the signal wiring conductor; and a grounding conductor layer formed in such a manner as to surround the signal wiring conductor and the ball-shaped signal terminal mounting pad, wherein, in the interlayer grounding conductor layer opposed to the signal wiring conductor is provided a conductive layer non-forming portion so as to be located in a region directly above the ball-shaped signal terminal mounting pad, and wherein an effective distance from the ball-shaped signal terminal mounting pad to the interlayer grounding conductor layer is made greater than an effective distance from the ball-shaped signal terminal mounting pad to the grounding conductor layer.

2. The high frequency semiconductor device housing package of claim 1, wherein through-hole conductors for electrically connecting the grounding conductor layer with the interlayer grounding conductor layer by passing through the dielectric layers are formed around the conductor layer non-forming portion at intervals not larger than one quarter of a guide wavelength of a high frequency signal.

3. The high frequency semiconductor device housing package of claim 1, wherein ball-shaped grounding terminals for physically and electrically connecting the grounding conductor layer with a grounding conductor on an external electric circuit board are formed in the grounding conductor layer around the ball-shaped signal terminal mounting pad at intervals not larger than one quarter of a signal wavelength of a high frequency signal.

* * * * *